United States Patent [19]

Saito et al.

[11] Patent Number: 4,796,155

[45] Date of Patent: Jan. 3, 1989

[54] LIQUID COOLING TYPE HIGH FREQUENCY SOLID STATE DEVICE

[75] Inventors: Toshiyuki Saito; Naofumi Okubo, both of Kawasaki; Yoshiaki Kaneko, Yokohama; Yasuyuki Tokumitsu, Isehara, all of Japan

[73] Assignee: Fujitsu Limited, Kawasaki, Japan

[21] Appl. No.: 88,520

[22] Filed: Aug. 20, 1987

Related U.S. Application Data

[63] Continuation of Ser. No. 675,868, Nov. 28, 1984, abandoned.

[30] Foreign Application Priority Data

| Nov. 29, 1983 | [JP] | Japan | 58-223103 |
| Nov. 30, 1983 | [JP] | Japan | 58-224304 |
| Nov. 30, 1983 | [JP] | Japan | 58-224307 |
| Dec. 22, 1983 | [JP] | Japan | 58-240826 |
| Dec. 27, 1983 | [JP] | Japan | 58-244537 |
| Dec. 29, 1983 | [JP] | Japan | 58-247693 |
| Jan. 13, 1984 | [JP] | Japan | 59-003555 |
| Jan. 13, 1984 | [JP] | Japan | 59-003556 |

[51] Int. Cl.$^4$ .................................. H01L 23/44
[52] U.S. Cl. .................. 361/385; 165/104.33; 357/82
[58] Field of Search ............ 357/82; 165/104.21, 165/104.33; 361/385

[56] References Cited

U.S. PATENT DOCUMENTS

| 3,270,250 | 8/1966 | Davis | 361/385 |
| 3,489,207 | 1/1970 | Miller | 357/82 |
| 3,972,063 | 7/1976 | Kimura et al. | 357/82 |
| 4,468,717 | 8/1984 | Mathias | 361/385 |

FOREIGN PATENT DOCUMENTS

| 921159 | 2/1973 | Canada. |
| 996667 | 9/1976 | Canada. |
| 1266244 | 5/1961 | France. |
| 2413847 | 7/1979 | France. |
| 2500959 | 9/1982 | France. |

OTHER PUBLICATIONS

Horowitz, P. et al, *The Art of Electronics*, Cambridge Press, Cambridge, NJ, 1981, pp. 565, 580, 581.
Ronkese, B. J., *Heat Sink*, IBM Technical Disclosure Bulletin, vol. 20, No. 9, 2/1978, pp. 3577-3578.

*Primary Examiner*—Albert W. Davis, Jr.
*Attorney, Agent, or Firm*—Staas & Halsey

[57] ABSTRACT

A liquid cooling type high frequency solid state device comprising: a solid state chip; at least one matching circuit connected to the solid state chip; a carrier for mounting the solid state chip and the matching circuit, constituting a solid state circuit to be cooled; a coolant vessel for containing a liquid coolant, with a space for coolant vapor at the top thereof; and an element for condensing the coolant vapor contained in the top space of the vessel. At least a part of the solid state circuit contacts the liquid coolant for boiling and evaporating the coolant. Amplitude modulation of the solid state circuit due to the boiling of the coolant is prevented.

2 Claims, 15 Drawing Sheets

LIQUID COOLING TYPE HIGH FREQUENCY SOLID STATE DEVICE

This is a continuation of co-pending application Ser. No. 675,868 filed on Nov. 28, 1984 now abandoned.

BACKGROUND OF THE INVENTION

The present invention relates to a liquid cooling system which operates by the boiling of a coolant for cooling a high frequency solid state device, such as an amplifier or an oscillator, which comprises a heat generating semiconductor chip, such as a transistor or a diode, for microwave or millimeter waves.

A high frequency solid state device is cooled by a boiling liquid type cooling system in which a liquid coolant is used as a cooling medium. The coolant is heated and boiled by the heat of the solid state device and evaporated to produce vapor bubbles and, thereby the heat of the solid state device being absorbed. The vapor is condensed to liquid and reused as the coolant.

In the liquid cooling system of the prior art, the semiconductor solid state chip is secured on the mount of the solid state device and is exposed and directly contacts the coolant. Therefore, the solid state chip is greatly influenced by the change of dielectric constant of the coolant due to the temperature change thereof, so that the frequency characteristic of the solid state chip is greatly changed. Also, the vapor bubbles generated in the boiling process of the coolant cause unstable change of the dielectric constant thereof, which causes noise of frequency from 0 Hz to 100 Hz along with amplitude modulation of the solid state device due to the noise. Also, waves leaked from the circuit of the solid state device are reflected by the bubbles or liquid surface and back to the solid state circuit, which causes amplitude modulation thereof. Besides the film boiling phenomenon occurs over the entire surface of the solid state chip, since the liquid coolant directly contacts with the chip, which prevents the heat radiation from the chip and causes destruction thereof.

SUMMARY OF THE INVENTION

The present invention was made considering the above points.

An object of the present invention is to provide a liquid cooling system by boiling coolant for cooling a high frequency solid state device, in which amplitude modulation of the solid state device is minimized to stabilize the frequency characteristic thereof.

The object is achieved, in accordance with the present invention, by a liquid cooling type high frequency solid state device comprising: a solid state chip; at least one matching circuit connected to the solid state chip; a carrier on which the solid state chip and the matching circuit are mounted to constitute a solid state device to be cooled; a coolant vessel in which a liquid coolant is contained and which provides an upper space for the vapor of the coolant; and a means for condensing the vapor of the coolant contained within the upper space of the vessel wherein, at least a part of the solid state device is arranged to contact the liquid coolant for boiling and evaporating the coolant, and amplitude modulation of the solid state device due to the boiling of the liquid coolant is prevented.

BRIEF DESCRIPTION OF THE DRAWINGS

FIG. 24(b) represents a transverse section thereof.

DESCRIPTION OF PREFERRED EMBODIMENTS

Figure 1:
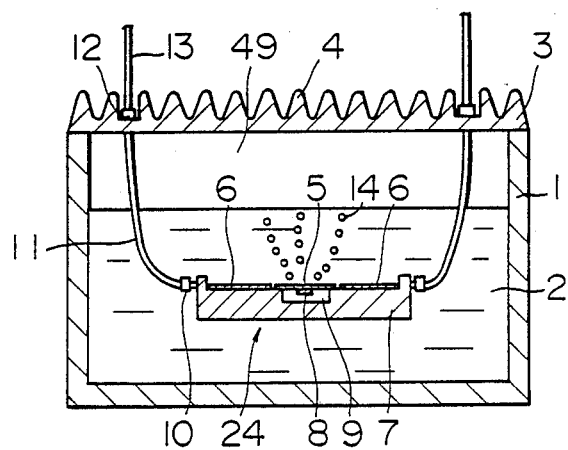
FIG. 1 is a constructional view of an embodiment of the present invention.
Figure 2:
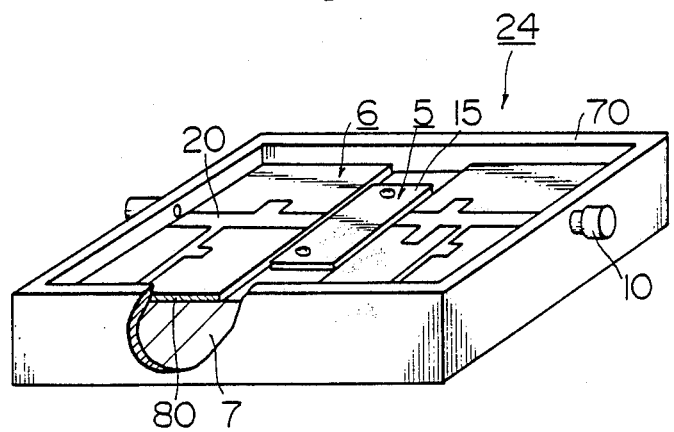
FIG. 2 is a perspective view of an example of the solid state device in accordance with the present invention.
Figure 3:
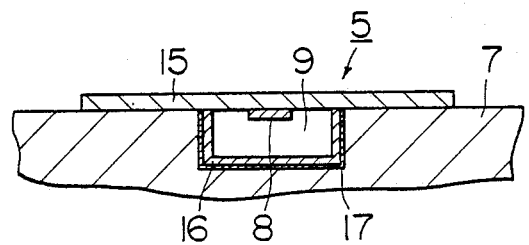
FIGS. 3 to 10 are constructional views of variations of the solid state device in accordance with the present invention.

An embodiment of the present invention is illustrated in FIG. 1. A liquid coolant 2 having a low boiling point, such as solution of freon or carbon fluoride is contained in a vessel 1, which provides a space 49 for vapor of the coolant 2 at the top thereof. The vessel 1 is covered and sealed by an upper plate 3 which has cooling fins 4 on the outer side thereof. A high frequency solid state device 24, such as an amplifier, is dipped in the coolant 2. The solid state device 24 is connected to a coaxial cable 11 via a coaxial connector 10 at each end thereof. The coaxial cable 11 is connected to coaxial cable 13 from outside via a coaxial connector 12 secured to the upper plate 3. The solid state device 24 comprises a semiconductor device 5 comprising a heat generating semiconductor chip 8 such as a field effect transistor (FET) and matching circuit devices 6 disposed on both sides of the semiconductor device 5, to adjust the impedance of the semiconductor chip 8 with the outer cables. The semiconductor device 5 and the matching circuit devices 6 are mounted on a metallic carrier 7. The carrier 7 is installed within a box 70, as is illustrated in FIG. 2. The bottom plate of the box 70 may be thick to serve as the carrier, thereby enabling the box 70 to be formed as one unit integrally with the carrier 7. The semiconductor chip 8 is secured to a metallic mount 5. The matching circuit device 6 comprises a dielectric plate 80 and a matching circuit pattern 20 formed by strip lines on the dielectric plate 80 and connected to the connector 10, on one end, and to the semiconductor chip 8 of the semiconductor device 5, on the other end. The semiconductor chip 8 is disposed within a recess 9 formed in the carrier 7. The mount 15 of the semiconductor chip 8 covers and seals the recess 9. In a preferred example of the semiconductor device, as is illustrated in FIG. 3, the semiconductor chip 8 is sealed by a ceramic package 16 which is coated by a wave absorber layer 17 comprising, for example ferrite or carbon to minimize the effect of noise waves and to prevent leakage of waves from the chip.

The function for cooling the heat generative semiconductor chip 8 is as follows. The heat of the semiconductor chip 8 is transferred to the liquid coolant 2 through the mount 15 and the coolant 2 is heated to its boiling temperature. The coolant 2 boils and generates vapor bubbles 14, due to the evaporation of the liquid coolant, thus absorbing heat from the semiconductor chip 8. The vapor of the coolant fills the top space 49 of the vessel 1. The heat of the vapor is discharged through the cooling fins 4 of the upper plate 3. Thereby, the vapor is condensed and drops as liquid coolant.

The semiconductor chip 8 of the above-mentioned solid state device 24 is arranged to be hindered from coming in direct contact with the liquid coolant 2, by disposing the chip mount 15 between the liquid coolant and the chip 8 in a manner such that the chip 8 is disposed and sealed in the recess of the carrier 7. Therefore, the semiconductor chip 8 is not influenced by vapor bubbles 14 which cause amplitude modulation of the solid state device 24, and the frequency characteristic of the semiconductor chip 8 is stabilized irrespective of the change of of the dielectric constant due to the coolant temperature change. Also, the problem of destruction of the chip 8 due to the film boiling around the chip surface is obviated. The amplitude modulation of the matching circuit is also minimized with this structure.

Figure 4:
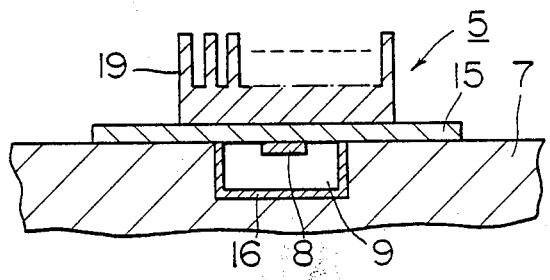

A radiator 19 having fins may be attached to the mount 15 of the semiconductor device 5, as illustrated in FIG. 4, to enhance the efficiency for cooling the semiconductor chip 8.

Figure 5:
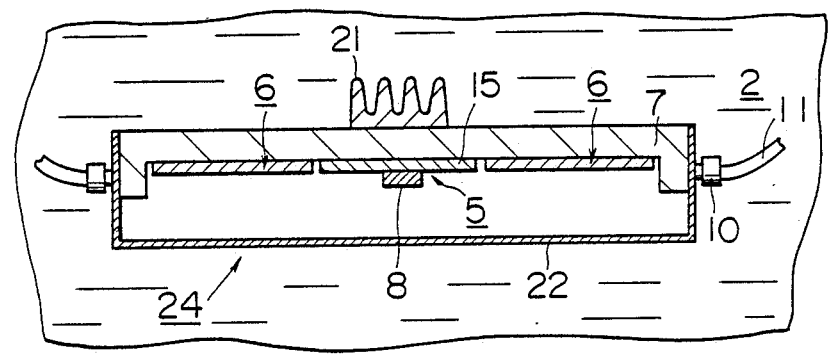

FIG. 5 represents another example of the solid state device 24 in accordance with the present invention. In this example, the solid state device 24 comprises a cover 22 which covers one entire surface of the carrier on which surface the semiconductor device 5 and the matching circuit devices 6 are mounted. The solid state device 24 is dipped in the liquid coolant 2 in a manner such that the rear surface (on which the semiconductor device 5 and the matching circuit devices 6 are not mounted) of the carrier 7 is disposed in the upside so that the vapor bubbles are generated in the upper side of the solid state device 24 and smoothly moves upward. The cooling effect is enhanced by attaching a radiator 21 on the carrier 7.

Figure 6:
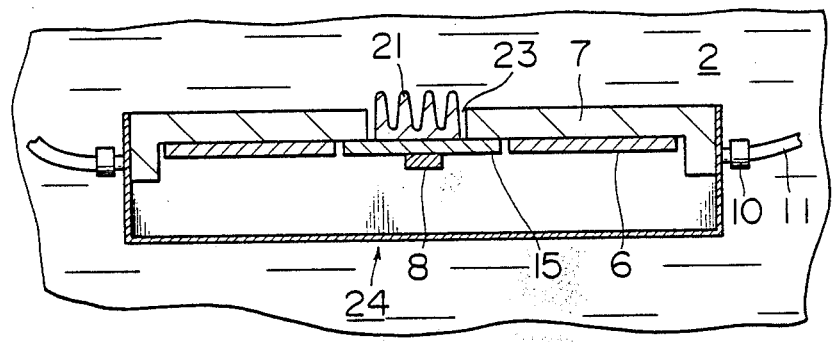

FIG. 6 represents a variation of the solid state device 24 of FIG. 5. In this example, an opening 23 is formed in the carrier 7 at the location behind the semiconductor chip 8. The radiator 21 is attached directly to the rear side of the mount 15 of the semiconductor chip 8. Cooling effect is further enhanced when compared with the example of FIG. 5. In the examples of FIGS. 5 and 6, the radiator 21 may be deleted.

Figure 7:
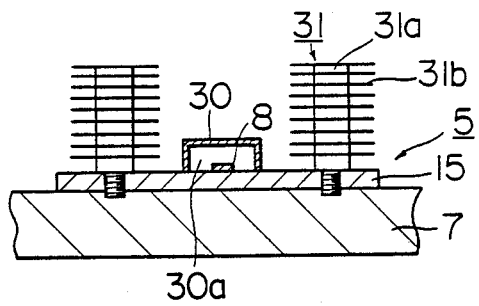

Another embodiment of the present invention is illustrated in FIG. 7. A package type semiconductor device 5 is mounted on the carrier 7. The semiconductor chip 8 is mounted on the mount 15 and enclosed and sealed by a package 30, forming a space 30a between the package 30 and the semiconductor chip 8. A radiator 31 comprising fins 31b attached to a pillar 31a is disposed on each side of the package 30 on the mount 15. With this construction, when the semiconductor device 5 is dipped in the liquid coolant, the semiconductor chip 8 does not come in direct contact with the liquid coolant. Therefore, amplitude modulation can be prevented similarly as the case of example of FIG. 1.

Figure 8:
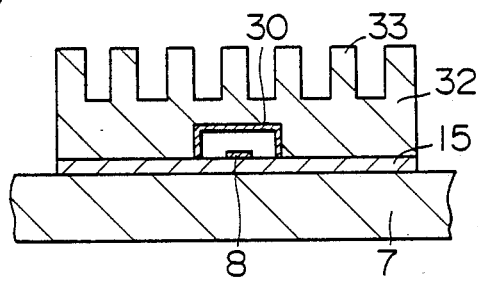

FIG. 8 represents a variation of the example of the semiconductor device of FIG. 7. In this example, the package 30 is covered by a metallic block 32 for shielding wave radiation from the solid state chip. Fins 33 are formed on the block 32 for radiating heat of the semiconductor device 5.

Figure 9:
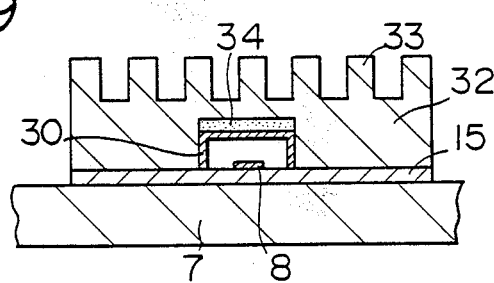

FIG. 9 represents a variation of the semiconductor device of FIG. 8. A wave absorber 34 is disposed on the package 30 to absorb waves leaked from the semiconductor device 5 and to prevent the leaked waves from being reflected back toward the semiconductor device 5, thereby preventing amplitude modulation.

Figure 10:
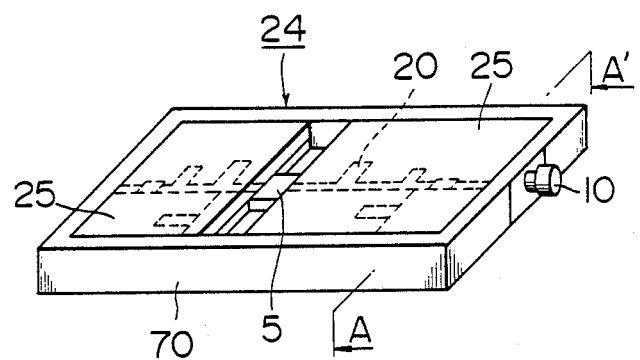
Figure 11:
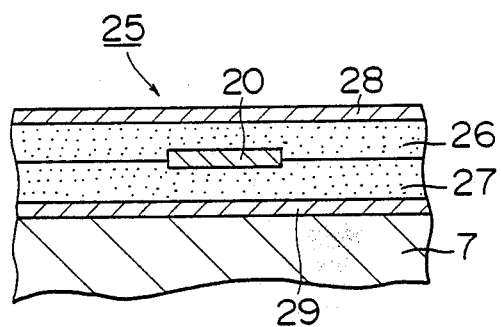
FIG. 11 is a partial sectional view along the line A—A' of FIG. 10.

Another embodiment of the present invention is illustrated in FIGS. 10 and 11. In this example, the matching circuit device 25 is formed in a triplate structure. The matching circuit pattern 20 is formed between two dielectric layers 26 and 27. Conductive layers 28 and 29 are coated on the upper and lower surfaces of the assembly of the two dielectric layers 26 and 27. Such a triplate structure stabilizes the impedance of the matching circuit irrespective of change of ambient temperature and ambient dielectric constant. By using such a matching circuit, amplitude modulation can be minimized.

Figure 12:
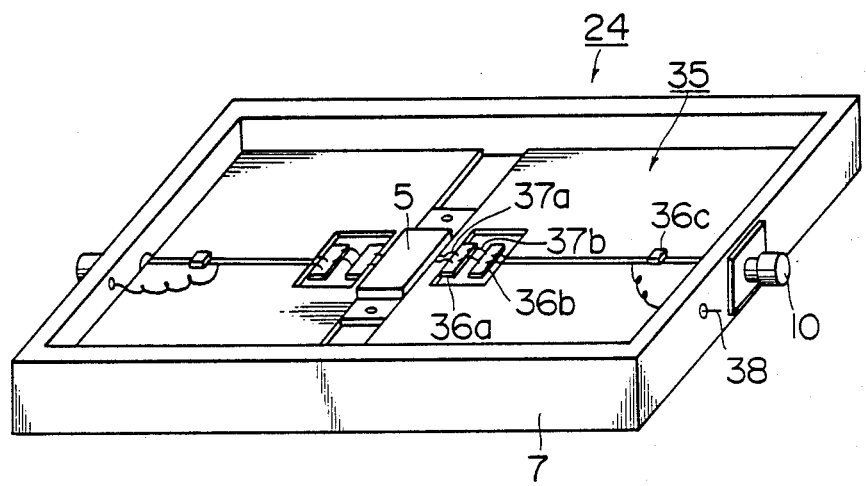
FIG. 12 is a perspective view of another example of the solid state device of the present invention.
Figure 13:
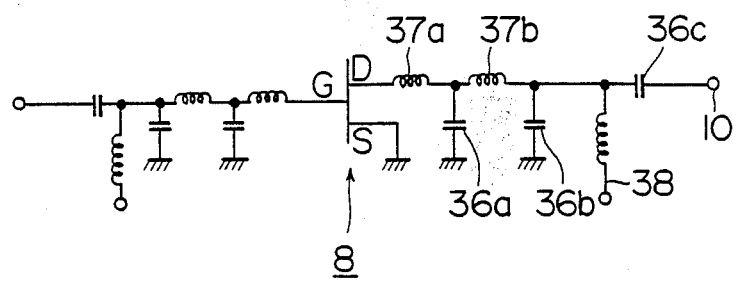
FIG. 13 is a circuit diagram of the solid state device of FIG. 12.

Another example of the solid state device in accordance with the present invention is illustrated in FIG. 12. FIG. 13 is a circuit diagram of the solid state device of FIG. 12. In this example, the matching circuit is formed as a lumped elements type matching circuit 35. The semiconductor device 5 comprises a FET 8 as the semiconductor chip. The FET 8 comprises a gate (G), a source (S) and a drain (D). The matching circuit 35 comprises two chip capacitors 36a and 36b, a capacitor 36c for blocking DC, a wire 38 for biasing DC, and inductors 37a and 37b, as illustrated in FIG. 13. The impedance of the lumped elements type matching circuit 35 is stable irrespective of change of ambient temperature and ambient dielectric constant. By using such a matching circuit, amplitude modulation can be minimized.

Figure 14:
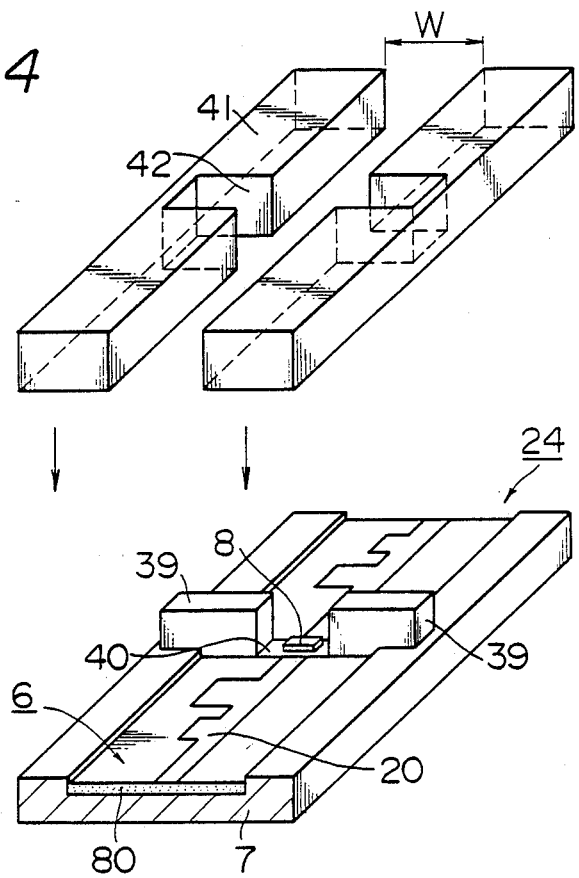
FIG. 14 is a perspective view of further example of the solid state device of the present invention.
Figure 15:
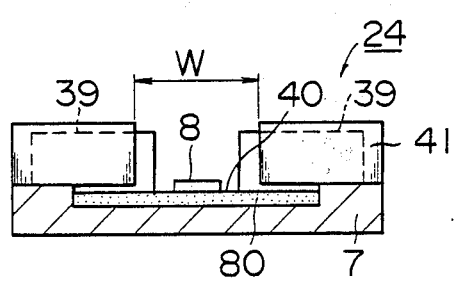
FIG. 15 is a sectional view of the solid state device of FIG. 14.

Another example of the solid state device in accordance with the present invention is illustrated in FIGS. 14 and 15. The carrier 7 comprises a mount 40 in the center thereof and radiator blocks 39 on both sides of the mount 40, projecting higher than the mount 40. The mount 40 and the radiator blocks 39 are formed as one body with the carrier 7. The semiconductor chip 8 is directly mounted on the mount 40. Two parallel metallic bars 41 having a rectangular cross section are disposed on both edges of the carrier 7 along the strip line pattern 20 of the matching circuit device 6. The metallic bars 41 are arranged to prevent the leakage of waves from the matching circuit. Width W between the two bars 41 is equal to so called cut-off dimension which is determined according to the functional frequency of the matching circuit and the ambient dielectric constant. A recess 42 for receiving the radiator 39 is formed in each bar 41.

The solid state device 24 having the above-mentioned construction is dipped in a liquid coolant. Heat of the semiconductor chip 8 is discharged through the radiators 39 to the coolant. Therefore, the vapor bubbles of the coolant are generated mainly around the radiators 39 and the bubbles generated on the chip surface are reduced. The amplitude modulation due to the bubbles is minimized, accordingly. Besides, wave leakage from the matching circuit is prevented by the function of the two metallic bars 41 disposed in parallel and apart from each other by a distance of the cut-off dimension. Therefore, the amplitude modulation due to the waves leaked from the matching circuit and reflected by the vapor bubbles or the liquid surface is prevented.

Figure 16:
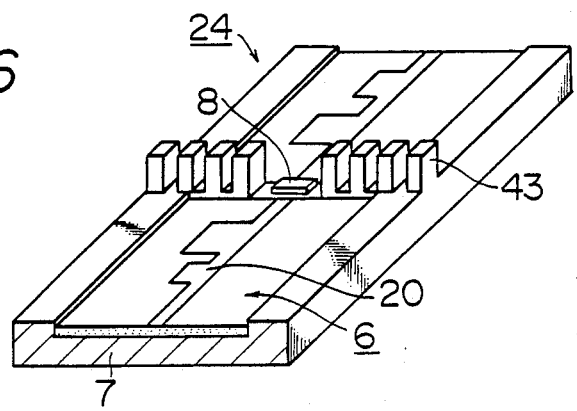
FIG. 16 is a perspective view of variation of the solid state device of FIG. 14.

FIG. 16 represents a variation of the solid state device of FIG. 14. In this example, cooling fins 43 are formed instead of the radiator block 39 of FIG. 14 to enhance the cooling efficiency and further reduce the bubbles generated on the chip surface.

Figure 17:
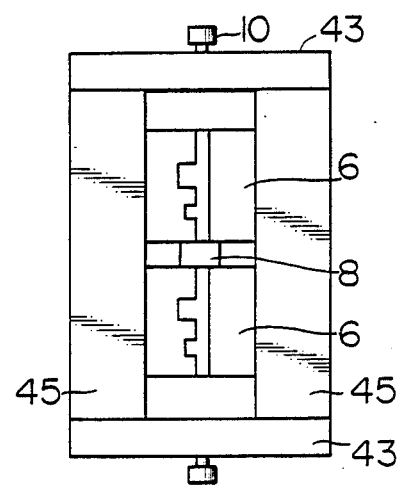
FIG. 17 is an upper view of a further example of the solid state device of the present invention.
Figure 18:
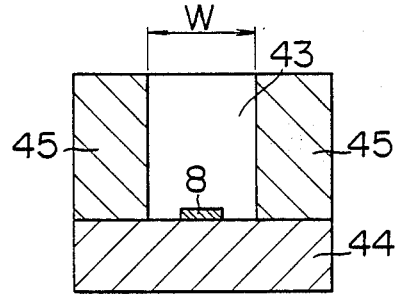
FIG. 18 is a sectional view of the solid state device of FIG. 17.

Another variation of the solid state device is illustrated in FIGS. 17 and 18. In this example, the semiconductor chip 8 is directly mounted on the upper plane surface of a rectangular parallelepiped carrier 44. Side walls 45 which serve as the radiator 39 and the parallel metallic bars 41 are disposed on both edges of the carrier 44. The width W between the walls 45 is equal to the cut-off dimension. The height of the walls 45 is determined, according to the semiconductor chip to be used, by experiment for example, considering the required cooling effect and wave leakage prevention effect. End walls 43 are disposed to enhance the wave shield effect.

Figure 19:
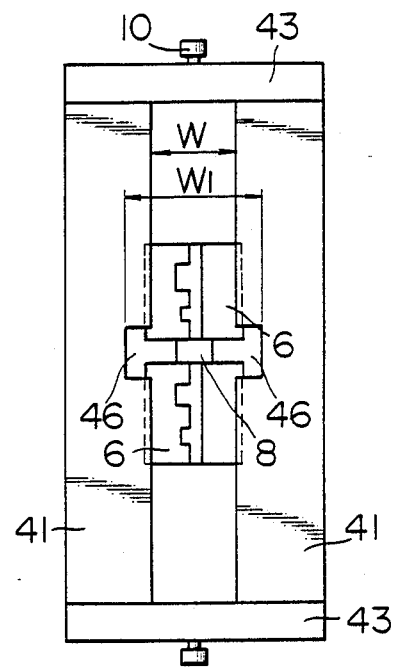
FIG. 19 is an upper view of a variation of the solid state device of FIG. 17.
Figure 20:
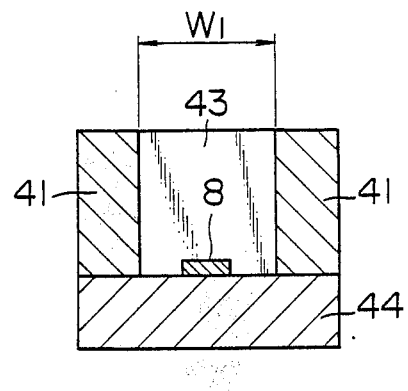
FIG. 20 is a sectional view of the solid state device of FIG. 19.

Another variation of the solid state device in accordance with the present invention is illustrated in FIGS. 19 and 20. In this example, the width between the two parallel side walls 41 is widened at the portion of the semiconductor chip 8 for a smooth upward movement of bubbles. The cut-off dimension is usually less than one half of the wavelength of frequency used in the circuit. Therefore, the width W becomes very small when the frequency is very high, so that the bubbles do not smoothly move upward. For a smooth upward movement of the bubble, the gap between the two walls 41 is desirably five times as wide as the diameter of the bubble (about 0.2 mm). Therefore, if the cut-off dimension is less than about 1 mm, the width $W_1$ (FIG. 20) of the gap between the walls 41 at the portion of semiconductor chip 8 is widened. Other constructions, functions and effects of this example are substantially the same as those of the example of FIG. 17.

Figure 21:
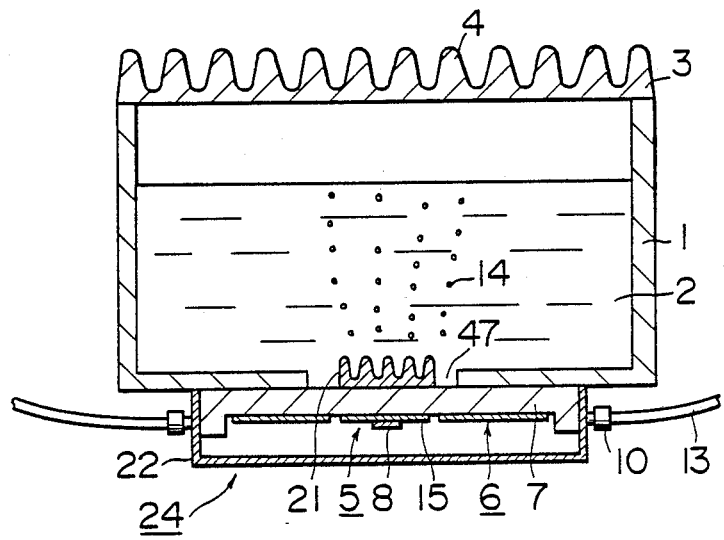
FIG. 21 is another embodiment of the present invention.

Another embodiment of the present invention is illustrated in FIG. 21. In this example, an opening 47 is formed in the bottom plate of the vessel 1. The solid state device 24 is attached to the vessel 1 in a manner that the rear side of the carrier 7 behind the semiconductor chip 8 faces the bottom opening 47 of the vessel 1. A radiator 21 is attached to the rear surface of the carrier 7. With this construction, only the portion around the heat generating part contacts with the coolant to effectively cool the solid state device with a small amount of coolant. Thereby, the overall structure becomes small. The effect of preventing amplitude modulation is similary obtained as in the examples of FIGS. 1 to 9, since the semiconductor chip 8 does not directly contact the liquid coolant.

Figure 22:
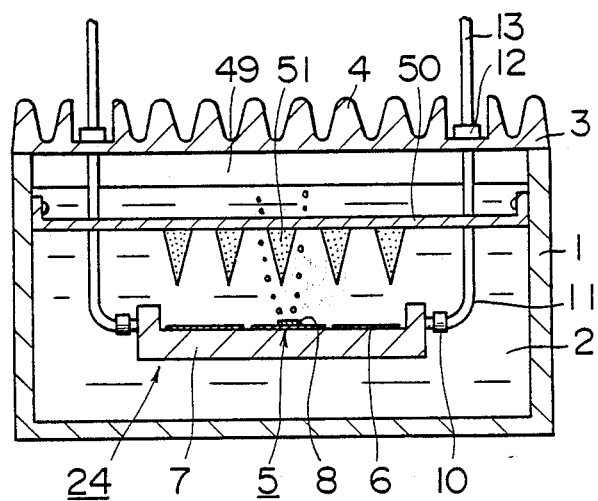
FIG. 22 is still another embodiment of the present invention.

Another embodiment of the present invention is illustrated in FIG. 22. A purality of conical wave absorbers 51 are attached to a support plate 50 which is secured to the coolant vessel 1. The wave absorbers 51 are disposed above the solid state device 24 to be cooled, so that leakage waves leaked from the solid state circuit are absorbed and prevented from being reflected by the bubbles or the liquid surface. The amplitude modulation due to the bubbles is minimized, accordingly.

Figure 23:
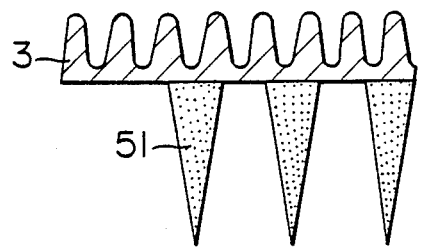
FIG. 23 is a partial constructional view of a variation of the embodiment of FIG. 22.

The shape of the wave absorber 51 is not limited to the conical shape. The shape, size, number and position of the wave absorbers 51 are determined according to the size and characteristics of the solid state circuit. The wave absorbers 51 may be directly attached to the lower side of the upper plate 3 of the vessel 1, as illustrated in FIG. 23.

Figure 24:
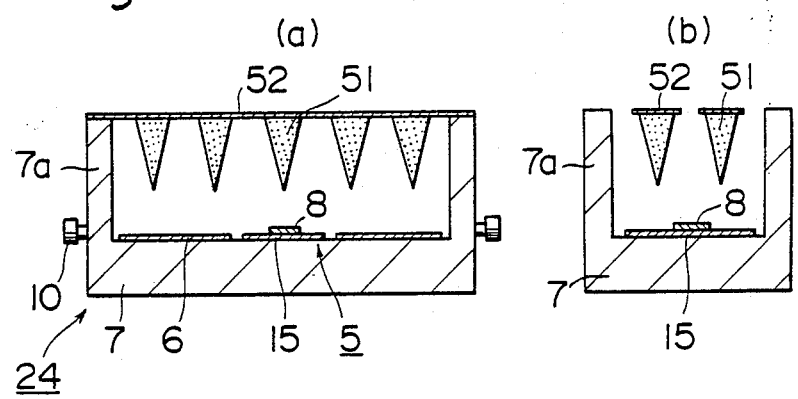
FIG. 24 (a) and (b) show a variation of the solid state device of FIG. 22, FIG. 24(a) representing a longitudinal section thereof

Other variations of the solid state device are illustrated in FIGS. 24(a) and (b) which respectively show a. A plurality of wave absorbers 51 are attached to two upper plates 52 which are secured to the walls 7a of the carrier 7, and suspended above the semiconductor chip 8.

Figure 25:
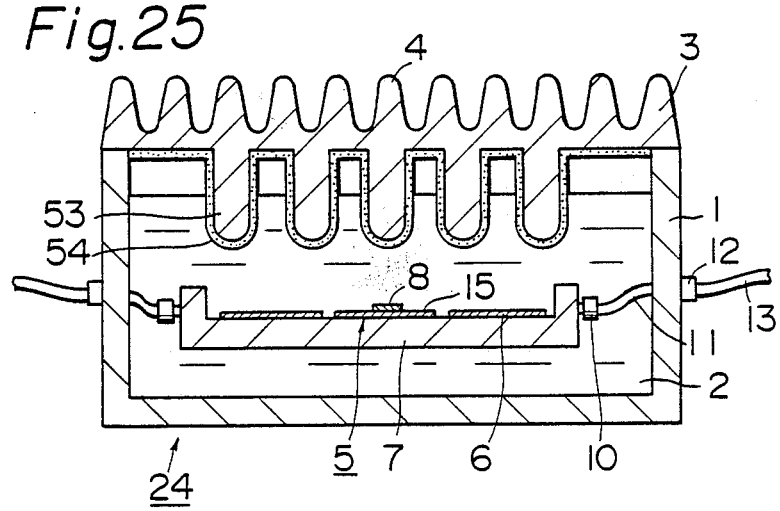
FIG. 25 is a sectional view of a variation of the embodiment of FIG. 22.

A variation of the embodiment of FIG. 22 is illustrated in FIG. 25. In this example, heat absorbing fins 53 are formed below the upper plate 3 for promoting the condensation of the coolant vapor. A wave absorber layer 54 covers the surface of the fins 53.

Figure 26:
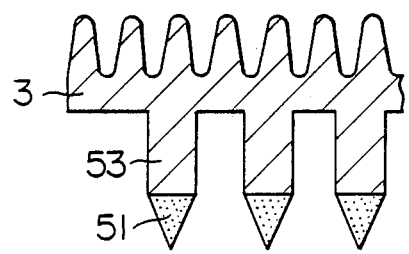
FIG. 26 is a partial sectional view of another variation of the embodiment of FIG. 22.

FIG. 26 represents another arrangement of the wave absorber. A wave absorber 51 is secured to the lower end of each heat absorbing fin 53.

Figure 27:
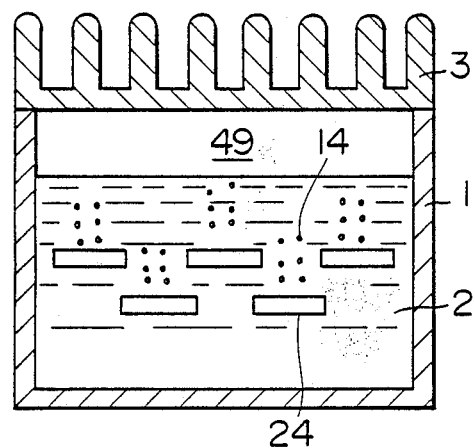
FIG. 27 is a constructional view of an arrangement of a plurality of solid state devices in accordance with the present invention.

FIG. 27 represents an arrangement in which a plurality of solid state devices are disposed in a coolant vessel, in accordance with the present invention. A plurality of solid state devices 24 are disposed in two rows, i.e., upper row and lower row, in a staggered manner, so that the bubbles generated from the solid state devices in the lower row do not contact with the solid state devices in the upper row, in the upward movement thereof, thereby preventing the amplitude modulation due to the bubbles.

Figure 28:
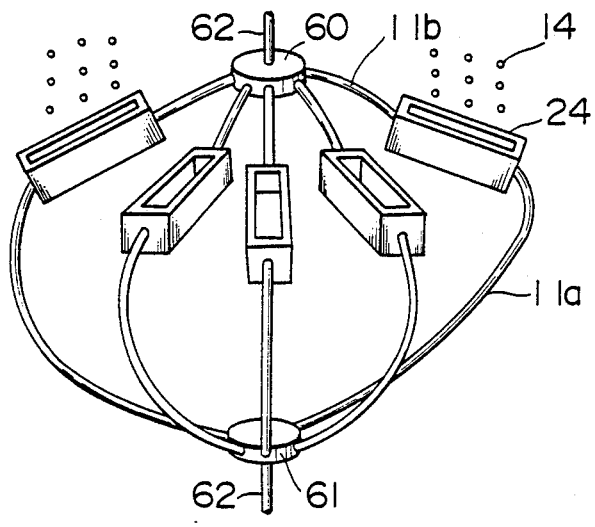
FIG. 28 is a perspective view of another arrangement of a plurality of solid state devices in accordance with the present invention.

FIG. 28 represents another arrangement of a plurality of the solid state devices in accordance with the present invention. A plurality of solid state devices 24 are disposed radially. An input coaxial cable 11a of each solid state device 24 is connected to a distributor 61 and an output coaxial cable 11b of each solid state device 24 is connected to a coupler 60. Each of the coupler 60 and the distributor 61 is connected to the outside device (not shown) through a coaxial cable 62.

With this arrangement, bubbles 14 generated from each solid state device 24 do not contact with the other solid state devices 24. Solid state devices 24 can be disposed close together, since cooling efficiency is upgraded, as mentioned above, in accordance with the various embodiments of the invention. Therefore, the coaxial cables 11a, 11b can be shortened, which results in increase of coupling efficiency and the coolant vessel become small. Also, the length of each cable connected to each solid state device is equalized, which results in equality of the characteristics of each solid state device.

Figure 29:
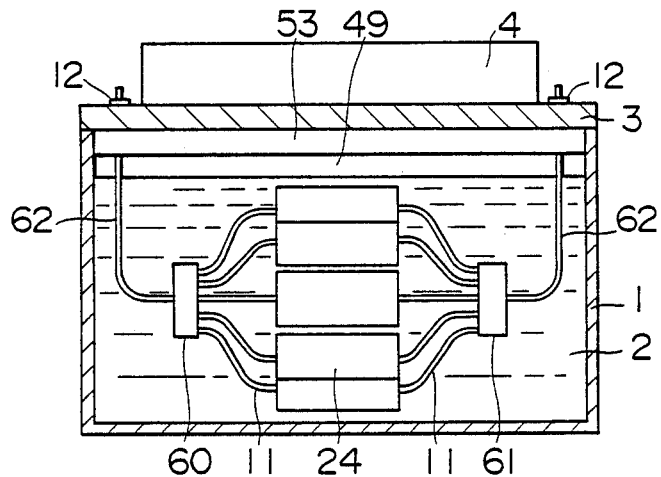
FIG. 29 is a constructional view of still another arrangement of a plurality of solid state devices in accordance with the present invention.
Figure 30:
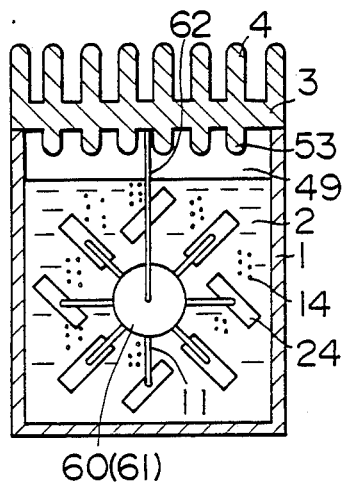
FIG. 30 is a sectional view of the structure of FIG. 29.

FIG. 29 represents another arrangement of a plurality of solid state devices. A plurality of solid state devices 24 are disposed annularly in a manner such that the connecting points of the cable 11 of solid state devices 24 are positioned on a circle at regular intervals. Each solid state device 24 is inclined in the liquid coolant 2, as illustrated in FIG. 30. With such an inclined arrangement of each solid state device, when bubbles from the lower solid state device contact with the lower surface of the upper solid state device, the bubbles smoothly move along the inclined under surface of the upper solid state device and do not stay there.

Figure 31:
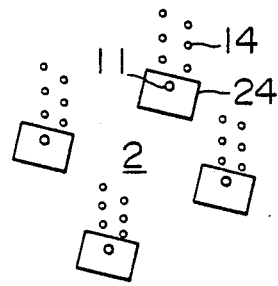
FIG. 31 is a partial constructional view of a further arrangement of a plurality of solid state devices in accordance with the present invention.

In the arrangement of a small number of solid state devices, it is desirable to dispose the solid state devices 24 in a staggered manner with respect to the vertical direction, so that bubbles from a lower solid state device do not contact with an upper solid state devices, as illustrated in FIG. 31.

Figure 32:
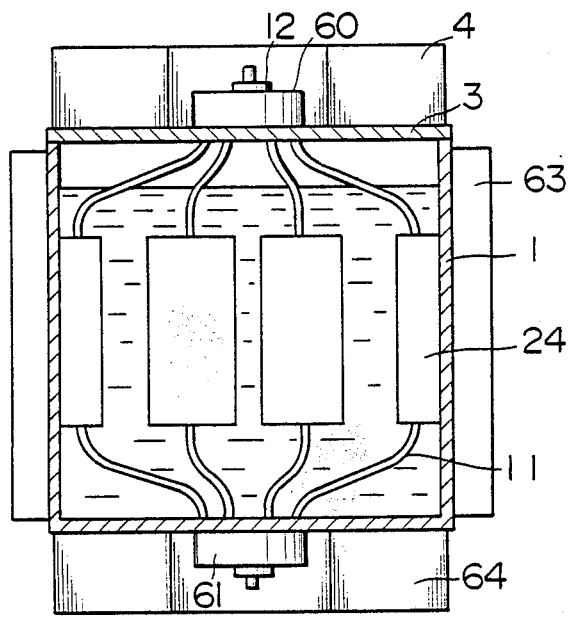
FIG. 32 is a vertical sectional view of a further arrangement of a plurality of solid state devices in accordance with the present invention.
Figure 33:
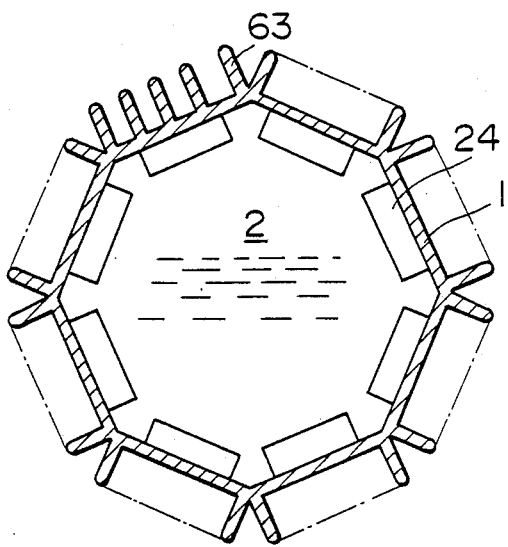
FIG. 33 is a horizontal sectional view of the structure of FIG. 32.
Figure 34:
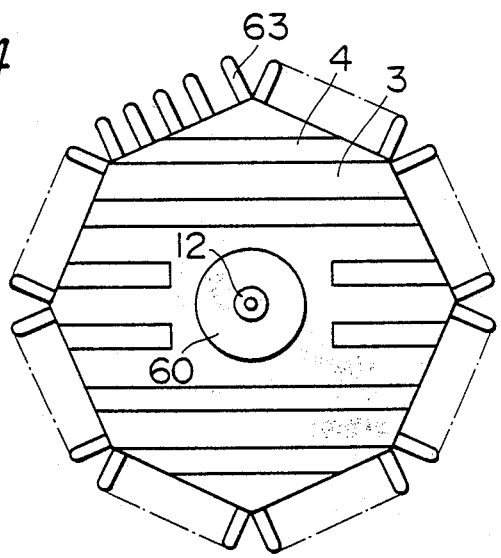
FIG. 34 is an upper view of the structure of FIG. 32.

Another arrangement of a plurality of solid state devices is illustrated in FIGS. 32 to 34, which represent a vertical section, a horizontal section and a top view of the structure, respectively. The coolant vessel 1 has the shape of polygonal pillar. A solid state device 24 is attached to the inside surface of a each side wall of the polygonal pillar shaped vessel 1. The solid state device 24 is, e.g., of the type of FIG. 5 or 6. The radiator 21 of the solid state device 24 (FIGS. 5 and 6) is oriented toward the inner side of the vessel 1. Radiator fins 63 are provided on the outside surface of each side wall of the vessel 1. The coupler 60 is disposed on the upper side of the upper plate 3 and the distributor 61 is disposed on the lower side of the bottom plate of the vessel 1. Radiator fins 64 are also provided on the outside surface of the bottom plate of the vessel 1.

With this construction, the cooling efficiency is enhanced because of the radiator fins 63 and 64, which enables a more compact arrangement of the solid state devices. Also, means for sealing the coupler 60 and the distributor 61, respectively, are not required, since they are disposed on the outside of the vessel 1.

In the drawings of the above-mentioned various embodiments, the same parts or corresponding parts are marked by the same number and the description of the part is deleted.

It is, of course, possible to combine any parts of any embodiments together with other parts of other embodiments of the invention to constitute another embodiment within the scope; of the present invention.

We claim:

1. A liquid cooling type high frequency solid state apparatus, comprising:
    a solid state chip;
    at least one matching circuit, having a cut-off dimension and connected to said solid state chip;
    a carrier supporting said solid state chip and said matching circuit and constituting, together with said solid state ship and said matching circuit, a device to be cooled;
    a coolant vessel for containing a liquid coolant, with a space for coolant vapor at the top thereof, at least a part of said solid state device contacting the liquid coolant for boiling the and evaporation the liquid coolant;
    condensing means for condensing the coolant vapor contained in the space at the top of said coolant vessel; and
    amplitude modulation reduction means for reducing amplitude modulation of said solid state device due to the boiling of the liquid coolant, said amplitude modulation reduction means comprising:
        radiator means, disposed on both sides of and adjacent to said solid state chip, for radiating heat generated by said solid state chip; and
        two parallel metallic bars, disposed on both sides of said solid state chip with said radiator means therebetween, for preventing wave leakage from said matching circuit, a distance between said two bars being equal to the cut-off dimension.

2. An apparatus according to claim 1, wherein walls are located on said carrier on both sides of said solid state chip to provide both said radiator means and said parallel metallic bars.

* * * * *

UNITED STATES PATENT AND TRADEMARK OFFICE
CERTIFICATE OF CORRECTION

PATENT NO. : 4,796,155  
DATED : January 3, 1989  
INVENTOR(S) : Toshiyuki Saito It is certified that error appears in the above-identified patent and that said Letters Patent is hereby corrected as shown below:

Col. 1, line 20, "bubbles and," should be --bubbles, and--;

Col. 1, line 21, "being" should be --is--;

Col. 1, line 39, after "Besides" insert --,--;

Col. 1, line 64, "vessel wherein," should be --vessel; wherein--.

Col. 2, line 40, after "22", insert --wherein--;

Col. 2, line 40, "representing" should be --represents--.

Col. 3, line 28, "5" should be --15--;

Col. 3, line 65, delete "of" (second occurrence);

Col. 4, line 25, "Cool-" should be --The cool- --.

Col. 6, line 2, after "of" (second occurrence) insert --the--;

Col. 6, line 30, "purality" should be --plurality--;

UNITED STATES PATENT AND TRADEMARK OFFICE
CERTIFICATE OF CORRECTION

PATENT NO. : 4,796,155

DATED : January 3, 1989

INVENTOR(S) : Toshiyuki Saito

It is certified that error appears in the above-identified patent and that said Letters Patent is hereby corrected as shown below:

```
Col. 6, line 47, delete ". A";

Col. 6, line 63, delete "row" (first occurrence);

Col. 6, line 63, "row," should
      be   --rows,--.

Col. 7, line 43, after "of" insert --a--.

Col. 8, line 30, delete "the" (first occurance);

Col. 8, line 30, "evaporation" should be
      --evaporating--.
```

Signed and Sealed this

Twenty-ninth Day of August, 1989

Attest:

DONALD J. QUIGG

*Attesting Officer*   *Commissioner of Patents and Trademarks*